United States Patent
Kim et al.

(10) Patent No.: US 10,797,021 B2
(45) Date of Patent: Oct. 6, 2020

(54) SEMICONDUCTOR PACKAGES HAVING IMPROVED THERMAL DISCHARGE AND ELECTROMAGNETIC SHIELDING CHARACTERISTICS

(71) Applicant: Samsung Electronics Co., Ltd., Suwon-si, Gyeonggi-do (KR)

(72) Inventors: Won-keun Kim, Hwaseong-si (KR); Kyung-suk Oh, Seongnam-si (KR); Ji-han Ko, Hwaseong-si (KR); Kil-soo Kim, Hwaseong-si (KR); Yeong-seok Kim, Hwaseong-si (KR); Joung-phil Lee, Suwon-si (KR); Hwa-il Jin, Seongnam-si (KR); Su-jung Hyung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/382,376

(22) Filed: Apr. 12, 2019

(65) Prior Publication Data

US 2020/0075545 A1 Mar. 5, 2020

(30) Foreign Application Priority Data

Sep. 3, 2018 (KR) .................. 10-2018-0104781

(51) Int. Cl.
*H01L 25/065* (2006.01)
*H01L 21/56* (2006.01)
(Continued)

(52) U.S. Cl.
CPC ........ *H01L 25/0652* (2013.01); *H01L 21/561* (2013.01); *H01L 23/315* (2013.01);
(Continued)

(58) Field of Classification Search
CPC .............. H01L 25/0652; H01L 21/561; H01L 23/3128; H01L 23/315; H01L 23/367;
(Continued)

(56) References Cited

U.S. PATENT DOCUMENTS 9,685,426 B2 6/2017 Yu et al.
9,691,711 B2 6/2017 Mahajan et al.
(Continued)

FOREIGN PATENT DOCUMENTS

KR 10-2011-0030766 A 3/2011
KR 10-2013-0105151 A 9/2013
KR 10-1837514 B1 3/2018

OTHER PUBLICATIONS

Extended European Search Report dated Feb. 25, 2020 for corresponding European Application No. 19164601.7.

*Primary Examiner* — Jasmine J Clark
(74) *Attorney, Agent, or Firm* — Harness, Dickey & Pierce, P.L.C.

(57) ABSTRACT

A semiconductor package may include a first semiconductor chip on and electrically connected to a wiring substrate, an intermediate layer on the first semiconductor chip and covering an entire surface of the first semiconductor chip, a second semiconductor chip on the intermediate layer and electrically connected to the wiring substrate, a mold layer on the wiring substrate and covering the first semiconductor chip and the second semiconductor chip, the mold layer including one or more inner surfaces defining a mold via hole that exposes a portion of a surface of the intermediate layer, an electromagnetic shielding layer on the one or more inner surfaces of the mold layer and further on one or more outer surfaces of the mold layer, and a thermal discharge layer on the electromagnetic shielding layer in the mold via hole, such that the thermal discharge layer fills the mold via hole.

20 Claims, 20 Drawing Sheets

(51) Int. Cl.
*H01L 23/31* (2006.01)
*H01L 23/367* (2006.01)
*H01L 23/552* (2006.01)
*H01L 25/00* (2006.01)

(52) U.S. Cl.
CPC ........ *H01L 23/3128* (2013.01); *H01L 23/367* (2013.01); *H01L 23/552* (2013.01); *H01L 25/50* (2013.01); *H01L 2225/0651* (2013.01); *H01L 2225/06517* (2013.01)

(58) Field of Classification Search
CPC ............ H01L 23/552; H01L 25/50; H01L 2225/0651; H01L 2225/06517; H01L 2224/73265; H01L 2224/73253; H01L 2224/2919; H01L 2224/482; H01L 2224/47; H01L 24/48; H01L 24/49; H01L 24/16; H01L 24/32; H01L 2224/32245; H01L 2224/32145; H01L 2224/48106; H01L 2225/06589; H01L 2225/065; H01L 2225/37; H01L 23/4334; H01L 25/0657; H01L 2224/97; H01L 2224/85; H01L 2924/00014; H01L 2924/00
See application file for complete search history.

(56) References Cited

U.S. PATENT DOCUMENTS

| | | |
|---|---|---|
| 9,761,540 B2 | 9/2017 | Shih |
| 2006/0268519 A1 | 11/2006 | Bartley et al. |
| 2010/0244024 A1 | 9/2010 | Do et al. |
| 2012/0086109 A1 | 4/2012 | Kim et al. |
| 2013/0307128 A1 | 11/2013 | Lin et al. |
| 2015/0054148 A1 | 2/2015 | Jang et al. |
| 2016/0276307 A1* | 9/2016 | Lin ................ H01L 23/552 |
| 2017/0186697 A1 | 6/2017 | Dias et al. |
| 2017/0186699 A1 | 6/2017 | Li et al. |
| 2017/0263569 A1 | 9/2017 | Sommer et al. |
| 2018/0033738 A1 | 2/2018 | Kawabata et al. |
| 2018/0053731 A1 | 2/2018 | Sommer et al. |

* cited by examiner

SEMICONDUCTOR PACKAGES HAVING IMPROVED THERMAL DISCHARGE AND ELECTROMAGNETIC SHIELDING CHARACTERISTICS

CROSS-REFERENCE TO RELATED APPLICATION

This application claims the benefit, under 35 U.S.C. § 119, of Korean Patent Application No. 10-2018-0104781, filed on Sep. 3, 2018, in the Korean Intellectual Property Office, the disclosure of which is incorporated herein in its entirety by reference.

BACKGROUND

The inventive concepts relate to semiconductor packages, and more particularly, to semiconductor packages having improved thermal discharge and electromagnetic shielding characteristics.

As the speed and performance of electronic devices are increased, the thermal discharge characteristics of semiconductor packages included in electronic devices may be improved to improve the operational reliability of the electronic devices. In some cases, semiconductor packages may be vulnerable to damage or obstruction based on electromagnetic waves, which may result in degradation of the operational reliability of the electronic devices in which the semiconductor packages are included.

SUMMARY

The inventive concepts provide semiconductor packages having improved thermal discharge and electromagnetic shielding characteristics, such that the semiconductor packages may have improved resistance to damage or obstruction due to electromagnetic waves, such that electronic devices including said semiconductor packages may have improved operational reliability based on said improved thermal discharge and electromagnetic shielding characteristics of the semiconductor packages.

According to some example embodiments, a semiconductor package may include a first semiconductor chip on a wiring substrate, an intermediate layer on the first semiconductor chip, a second semiconductor chip on the intermediate layer, a mold layer on the wiring substrate, the mold layer covering the first semiconductor chip and the second semiconductor chip, an electromagnetic shielding layer on the one or more inner surfaces of the mold layer, the electromagnetic shielding layer, and a thermal discharge layer. The intermediate layer may cover an entire surface of the first semiconductor chip. The second semiconductor chip may be electrically connected to the wiring substrate. The mold layer may include one or more inner surfaces defining a mold via hole that exposes a portion of a surface of the intermediate layer. The electromagnetic shielding layer may be on the one or more inner surfaces of the mold layer. The electromagnetic shielding layer may further be on one or more outer surfaces of the mold layer. The thermal discharge layer may be on the electromagnetic shielding layer in the mold via hole, such that the thermal discharge layer fills the mold via hole.

According to some example embodiments, a semiconductor package may include a first semiconductor chip on a wiring substrate, an intermediate layer on the first semiconductor chip, a second semiconductor chip on the intermediate layer, a third semiconductor chip on the intermediate layer, a mold layer on the wiring substrate, an electromagnetic shielding layer on one or more inner surfaces of the mold layer, the electromagnetic shielding layer further on one or more outer surfaces of the mold layer, and a thermal discharge layer on the electromagnetic shielding layer in the mold via hole such that the thermal discharge layer fills the mold via hole. The first semiconductor chip may be electrically connected to the wiring substrate. The first semiconductor chip may include a logic chip. The intermediate layer may cover an entire surface of the first semiconductor chip. The second semiconductor chip may be electrically connected to the wiring substrate. The second semiconductor chip may include a memory chip. The third semiconductor chip may be isolated from direct contact with the second semiconductor chip. The third semiconductor chip may be electrically connected to the wiring substrate. The third semiconductor chip may include a separate memory chip. The mold layer may cover the first semiconductor chip, the second semiconductor chip, and the third semiconductor chip. The mold layer may include one or more inner surfaces at least partially defining the mold via hole that exposes a portion of the surface of the intermediate layer.

According to some example embodiments, a semiconductor package may include a first semiconductor chip on a wiring substrate, an intermediate layer on the first semiconductor chip, a second semiconductor chip on the intermediate layer, a third semiconductor chip on the intermediate layer, a mold layer on the wiring substrate, an electromagnetic shielding layer, and a thermal discharge layer. The first semiconductor chip may be electrically connected to the wiring substrate. The first semiconductor chip may include a logic chip, and the logic chip may include a heat source. The intermediate layer may cover an entire surface of the first semiconductor chip. The second semiconductor chip may be electrically connected to the wiring substrate. The second semiconductor chip may include a memory chip. The third semiconductor chip may be isolated from direct contact with the second semiconductor chip. The third semiconductor chip may be electrically connected to the wiring substrate. The third semiconductor chip may include a separate memory chip. The mold layer may cover the first semiconductor chip, the second semiconductor chip, and the third semiconductor chip. The mold layer may include a plurality of inner surfaces at least partially defining a plurality of mold via holes that expose a portion of a surface of the intermediate layer in both a center region between the second semiconductor chip and the third semiconductor chip and in an edge portion of the intermediate layer. The electromagnetic shielding layer may be on the plurality of inner surfaces of the mold layer. The electromagnetic shielding layer may further be on one or more outer surfaces of the mold layer. The thermal discharge layer may be on the electromagnetic shielding layer in each mold via hole of the plurality of mold via holes such that the thermal discharge layer fills the plurality of mold via holes.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
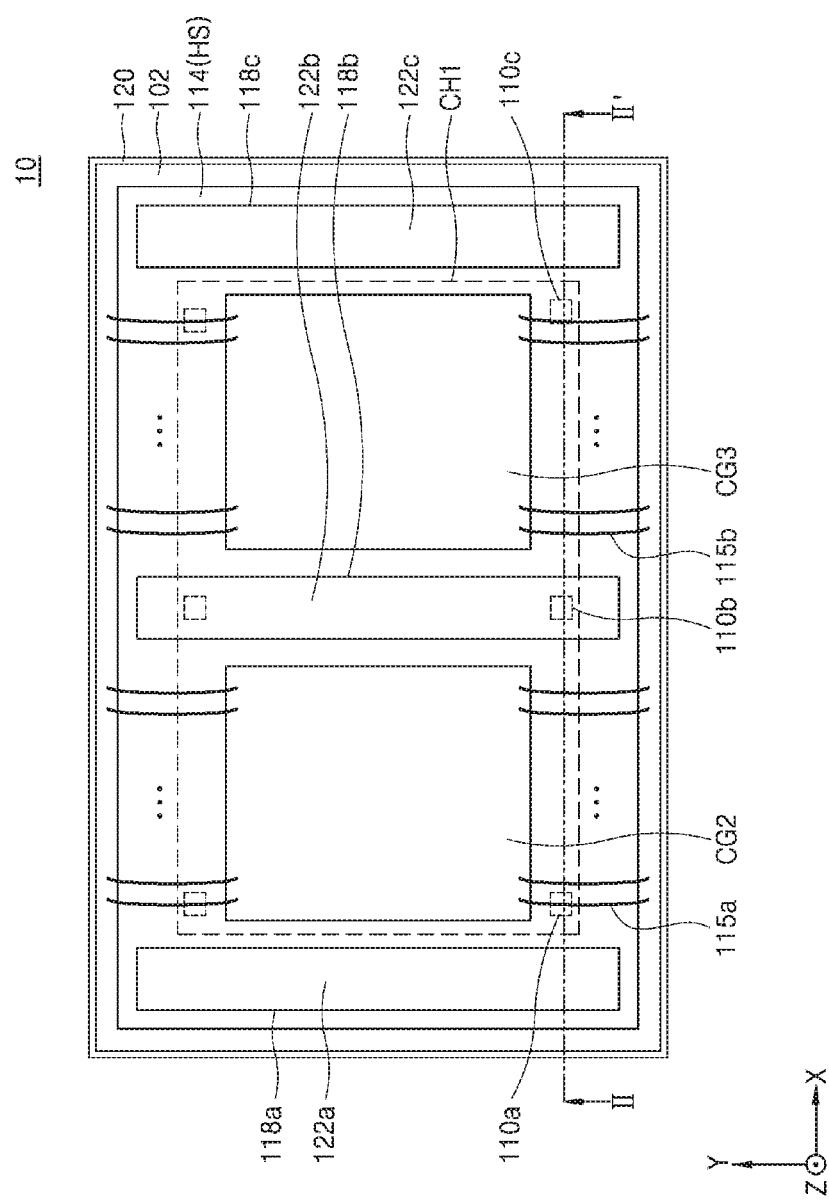
FIG. 1 is a plan view of a semiconductor package according to some example embodiments of the inventive concepts.

Example embodiments of the inventive concepts may be implemented by a certain one or a combination of one or more embodiments. Therefore, the spirit of the inventive concepts is not interpreted only by one example embodiment. The accompanying drawings are not necessarily illustrated at a certain ratio. In some embodiments, in order to clearly show characteristics of the embodiments, a ratio of at least a part of structures illustrated in the drawing may be exaggerated.

Figure 2:
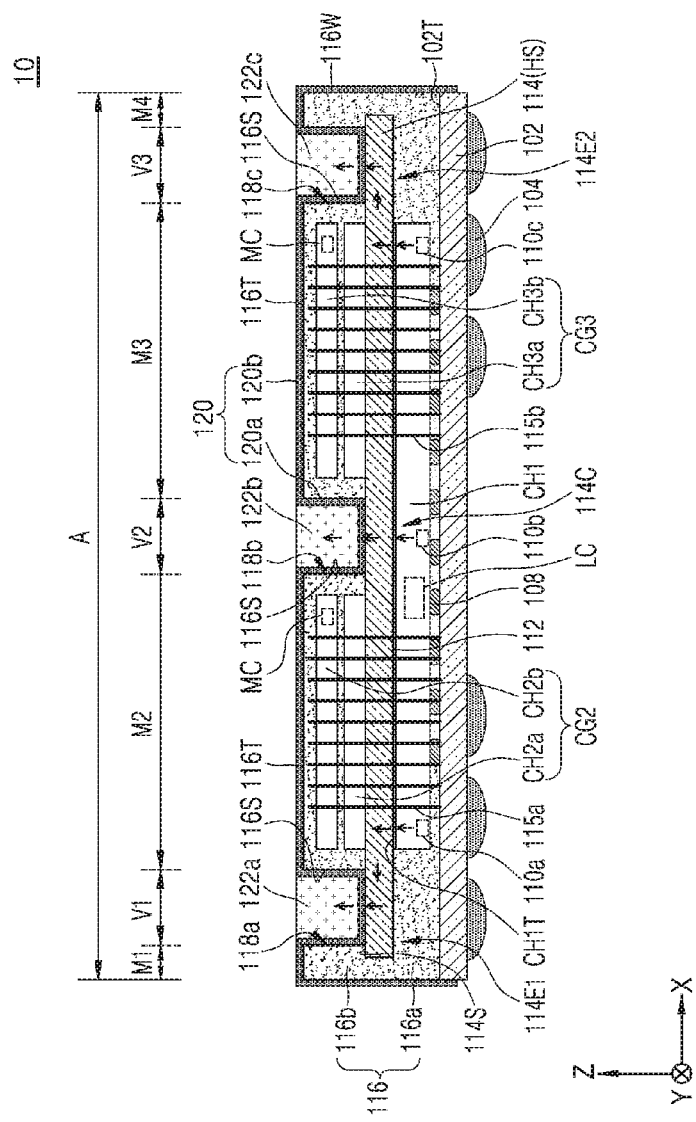
FIG. 2 is a cross-sectional view along view line II-II' of a main portion of the semiconductor package of FIG. 1 according to some example embodiments of the inventive concepts.

FIG. 1 is a plan view of a semiconductor package 10 according to some example embodiments of the inventive concepts. FIG. 2 is a cross-sectional view along view line II-II' of a main portion of the semiconductor package 10 of FIG. 1.

Specifically, FIG. 2 is a cross-sectional view of a main portion taken along a view line II-II' in FIG. 1. The semiconductor package 10 may be a system-in-package (SIP) or a multi stack package. The semiconductor package 10 may be an electronic system including a plurality of semiconductor chips. The semiconductor package 10 may be a processor, an application processor, a modem, or the like.

The semiconductor package 10 may include a wiring substrate 102, an intermediate layer 114, a first semiconductor chip CH1 on the wiring substrate 102, a second semiconductor chip CG2, a third semiconductor chip CG3, mold layers 116a and 116b, electromagnetic shielding layers 120a and 120b, and thermal discharge layers 122a, 122b, and 122c. In FIG. 1, the reference numerals of the electromagnetic shielding layers 120a and 120b are collectively denoted by 120.

The semiconductor package 10 of some example embodiments is shown as including the second semiconductor chip CG2 and the third semiconductor chip CG3 for convenience. However, the semiconductor package 10 may include only one of the second semiconductor chip CG2 and the third semiconductor chip CG3.

The wiring substrate 102 may be a printed circuit board (PCB) having a circuit pattern. The wiring substrate 102 may have a certain length in the X direction and a certain length in the Y direction perpendicular to the X direction. An external terminal 104 may be located on the lower surface of the wiring substrate 102 having a certain area. The external terminal 104 may include a conductive material and may have the shape of a solder ball. The external terminal 104 may electrically connect the first semiconductor chip CH1, the second semiconductor chip CG2, and the third semiconductor chip CG3 to an external electric device (not shown).

The first semiconductor chip CH1 may be attached and located on the wiring substrate 102. The first semiconductor chip CH1 may be electrically connected to the wiring substrate 102. The first semiconductor chip CH1 may be attached on the wiring substrate 102 in the Z direction perpendicular to the X-Y plane. The first semiconductor chip CH1 may be and/or include a logic chip (LC). The first semiconductor chip CH1 may include a central processing unit (CPU). The first semiconductor chip CH1 may include an integrated circuit, for example, a memory circuit, a logic circuit, or a combination thereof. The first semiconductor chip CH1 may include heat sources 110a, 110b, and 110c that generate heat. In some example embodiments, the first semiconductor chip CH1 may include an individual heat source of the heat sources 110a, 110b, and 110c. In some example embodiments, a heat source of the first semiconductor chip CH1 may be a heat source that is included in a logic chip LC that is included in the first semiconductor chip CH1.

The heat sources 110a, 110b, and 110c may be a block in which functions necessary for configuring an integrated circuit are implemented by hardware or software. For example, the heat sources 110a, 110b, and 110c may be a CPU or a circuit of a CPU. The heat sources 110a, 110b, and 110c may be determined by a circuit design of the first semiconductor chip CH1. The heat sources 110a, 110b, and 110c may be arranged apart from each other at edge portions of the first semiconductor chip CH1 in a plan view, as shown in FIG. 1.

A connection bump 108 may be located under the first semiconductor chip CH1. The connection bump 108 may be between the wiring substrate 102 and the first semiconductor chip CH1. The first semiconductor chip CH1 may be electrically connected to the wiring substrate 102 through ("via") the connection bump 108. The connection bump 108 may be a connection terminal for electrically connecting the first semiconductor chip CH1 to the wiring substrate 102. The connection bump 108 may include a conductive material.

The intermediate layer 114 may be attached on the first semiconductor chip CH1 by using an adhesive layer 112. The intermediate layer 114 may be a middle layer that transmits heat generated in the first semiconductor chip CH1. As shown in FIG. 2, the intermediate layer 114 may cover the entire upper surface CH1T of the first semiconductor chip CH1. The intermediate layer 114 may be a heat spreader HS. The heat spreader HS may disperse heat generated in the first semiconductor chip CH1. The heat spreader HS may include a material having high thermal conductivity, for example, metal, metal alloy, or carbon material.

The second semiconductor chip CG2 and the third semiconductor chip CG3 may each be attached on the intermediate layer 114. The second semiconductor chip CG2 and the third semiconductor chip CG3 may be located apart from each other on the intermediate layer 114. Restated, and as shown in FIG. 2, the third semiconductor chip CG3 may be isolated from direct contact with the second semiconductor chip CG2, although both the second and third semiconductor chips CG2 and CG3 may be directly on the intermediate layer 114. The second semiconductor chip CG2 and the third semiconductor chip CG3 may be different types of chips than the first semiconductor chip CH1. The second semiconductor chip CG2 and the third semiconductor chip CG3 may each be electrically connected to the wiring substrate 102.

The second semiconductor chip CG2 and the third semiconductor chip CG3 may be and/or include one or more memory chips (MC) including one or more memory circuits, for example, DRAM chips. The second semiconductor chip CG2 and the third semiconductor chip CG3 may each have a smaller size than the first semiconductor chip CH1.

The second semiconductor chip CG2 and the third semiconductor chip CG3 may be electrically connected to the wiring substrate 102. The second semiconductor chip CG2 and the third semiconductor chip CG3 may be electrically connected to the wiring substrate 102 by ("via") separate, respective bonding wires 115a and 115b.

As shown in FIG. 2, the second semiconductor chip CG2 may be and/or include a multilayer chip that includes a plurality of sub-chips CH2a and CH2b that are sequentially stacked on the intermediate layer 114. The third semiconductor chip CG3 may be a multilayer chip that includes a plurality of sub-chips CH3a and CH3b that are sequentially stacked on the intermediate layer 114. Accordingly, in some example embodiments, including the example embodiments shown in FIG. 2, each semiconductor chip of the second semiconductor chip CG2 and the third semiconductor chip CG3 may include a separate multilayer chip, and each separate multilayer chip including a separate plurality of sub-chips that are sequentially stacked on the intermediate layer 114. The sub-chips CH2a and CH2b, which constitute the second semiconductor chip CG2, and the sub-chips CH3a and CH3b, which constitute the third semiconductor chip CG3, may be electrically connected to the wiring substrate 102 by the bonding wires 115a and 115b, respectively.

The mold layers 116a and 116b may be formed on the wiring substrate 102 to cover the first semiconductor chip CH1, the second semiconductor chip CG2 and the third semiconductor chip CG3. As shown in FIG. 2, the mold layers 116a and 116b may collectively establish a mold layer 116 that is on the wiring substrate 102 and covers at least the first semiconductor chip CH1 and the semiconductor chip CG2. Such a mold layer 116 may cover the first, second and third semiconductor chips CH1, CG2, and CG3. The mold layer 116a may be formed on the wiring substrate 102 and under the intermediate layer 114. The mold layer 116b may be formed on the top and side walls of the intermediate layer 114. The mold layers 116a and 116b may include an insulating polymer such as an epoxy molding compound.

Mold via holes 118a, 118b, and 118c may be formed in the mold layer 116b on the intermediate layer 114. Accordingly, and as shown in at least FIG. 2, the mold via holes 118a, 118b, and 118c may each be at least partially defined by one or more inner surfaces 116S of the mold layer 116. In some example embodiments, the mold layer 116b may include one or more inner surfaces 116S that at least partially define a single, individual mold via hole of the mold via holes 118a, 118b, and 118c. The mold via holes 118a, 118b, and 118c may expose a portion of the surface 114S of the intermediate layer 114. As shown in FIG. 1, the mold via holes 118a, 118b, and 118c may be one or more mold via patterns each having a planar constant area on the intermediate layer 114. The mold via holes 118a, 118b, and 118c may be mold via patterns extending in the Y direction. As shown in FIG. 2, the mold via hole 118b may be on the intermediate layer 114 and may be between the second semiconductor chip CG2 and the third semiconductor chip CG3. As further shown in FIG. 2, the mold via hole 118b may be isolated from direct contact with either of the second semiconductor chip CG2 and the third semiconductor chip CG3. As further shown in FIG. 2, the mold via hole 118a is on an edge portion 114E1 of the intermediate layer 114, is proximate to the second semiconductor chip CG2 in relation to the third semiconductor chip CG3, and may be isolated from direct contact with the second semiconductor chip CG2. As further shown in FIG. 2, the mold via hole 118c is on an edge portion 114E2 of the intermediate layer 114, is proximate to the third semiconductor chip CG3 in relation to the second semiconductor chip CG2, and may be isolated from direct contact with the third semiconductor chip CG3. As further shown in FIG. 2, the mold via hole 118b exposes a portion of a surface 114S of the intermediate layer 114 in a center region 114C between the second and third semiconductor chips CG2 and CG3.

FIG. 2 illustrates an example in which upper diameters of the mold via holes 118a, 118b, and 118c are equal to lower diameters thereof and thus inner walls of the mold via holes 118a, 118b, and 118c are vertical. However, the upper diameters may be greater than or less than the lower diameters and thus the inner walls may not be vertical. The mold via holes 118a, 118b, and 118c may be referred to as mold trenches. The mold via holes 118a, 118b, and 118c may be referred to as mold through vias.

The electromagnetic shielding layers 120a and 120b may be formed inside the mold via holes 118a, 118b, and 118c and on the mold layers 116a and 116b. Restated, the electromagnetic shielding layers 120a and 120b may each be on one or more of the inner surfaces 116S of the mold layer 116 that at least partially define the one or more mold via holes 118a, 118b, and 118c and may further be on one or more outer surfaces 116T of the mold layer 116. The electromagnetic shielding layers 120a and 120b may collectively establish an electromagnetic shielding layer 120. The electromagnetic shielding layers 120a and 120b may surround the first semiconductor chip CH1, the second semiconductor chip CG2, and the third semiconductor chip CG3.

The electromagnetic shielding layer 120a may be formed to extend conformally (with a constant thickness) in the insides of the mold via holes 118a, 118b, and 118c, that is, on the bottoms and the inner walls (e.g., on one or more inner surfaces 116S) of the mold via holes 118a, 118b, and 118c. As shown in FIG. 2, the electromagnetic shielding layer 120a extends conformally on a surface (114S) defining a bottom of a mold via hole 118a, 118b, and/or 118c, and one or more inner surfaces 116S defining the inner wall of the mold via hole 118a, 118b, and/or 118c. The electromagnetic shielding layer 120b may be conformally formed on the one or more outer surfaces 116T and the both ("opposing") side walls 116W of the mold layers 116a and 116b (e.g., the opposing side walls 116W of the mold layer 116). The electromagnetic shielding layers 120a and 120b may include a material including a conductor and a magnetic material. The electromagnetic shielding layers 120a and 120b may be formed by dispersing a magnetic material in a metallic material.

The electromagnetic shielding layers 120a and 120b may surround the first semiconductor chip CH1, the second semiconductor chip CG2, and the third semiconductor chip CG3 and may be ground-connected to a metal wiring (not shown) of the wiring substrate 102. Accordingly, electromagnetic waves transmitted from the outside of the semiconductor package 10 may be shielded by the electromagnetic shielding layers 120a and 120b.

Electromagnetic waves generated by the first semiconductor chip CH1, the second semiconductor chip CG2, and the third semiconductor chip CG3 in the semiconductor package 10 may be grounded and removed by the electromagnetic shielding layers 120a and 120b and the metal wiring (not shown) of the wiring substrate 102. As a result, the first semiconductor chip CH1, the second semiconductor chip CG2, and the third semiconductor chip CG3 may not be damaged or obstructed by electromagnetic waves, due to the electromagnetic shielding layers 120a and 120b.

The thermal discharge layers 122a, 122b, and 122c may fill respective mold via holes 118a, 118b, and 118c on the electromagnetic shielding layer 120a in the respective mold via holes 118a, 118b, and 118c. Restated, each thermal discharge layer 122a, 122b, and 122c may be on the electromagnetic shielding layer 120a in a given mold via hole 118a, 118b, and 118c at least partially defined by one or more inner surfaces 116S of the mold layer 116, such that the given thermal discharge layer 122a, 122b, and 122c fills the given mold via hole 118a, 118b, and 118c. The mold via holes 118a, 118b, and 118c and the thermal discharge layers 122a, 122b, and 122c may correspond to the heat sources 110a, 110b, and 110c of the first semiconductor chip CH1. As shown in FIGS. 1 and 2, the mold via hole 118b may be formed on the intermediate layer 114 between the second semiconductor chip CG2 and the third semiconductor chip CG3.

The mold via hole 118a and the mold via hole 118c may be respectively formed in an edge portion of the intermediate layer 114 separated from one side of the second semiconductor chip CG2 and an edge portion of the intermediate layer 114 separated from one side of the third semiconductor chip CG3. Heat generated in the heat sources 110a, 110b, and 110c of the first semiconductor chip CH1 may be easily discharged to the outside through the intermediate layer 114, the electromagnetic shielding layers 120a and 120b, and the thermal discharge layers 122a, 122b, and 122c, as indicated by arrows in FIG. 2. As described herein a given mold via hole and thermal discharge layer may "correspond" to a given heat source where the semiconductor package is configured to discharge heat generated in the heat source to the exterior of the semiconductor package 10 through the given mold via hole and thermal discharge layer. For example, in FIG. 2, the mold via hole 118b and thermal discharge layer 122b will be understood to each "correspond" to the heat source 110b because the semiconductor package 10 is configured to discharge heat generated in the heat source 110b to the outside via at least the mold via hole 118b and thermal discharge layer 122b as opposed to other mold via holes and thermal discharge layers of the semiconductor package 10, as shown by the arrows extending from heat source 110b in FIG. 2. Similarly, mold via hole 118a and thermal discharge layer 122a will be understood to correspond to heat source 110a, and mold via hole 118c and thermal discharge layer 122c will be understood to correspond to heat source 110c for similar reasons and as shown by the pattern of arrows extending from the respective heat sources 110a and 110c as shown in FIG. 2.

As shown in FIG. 2, the upper level of the semiconductor package 10 that includes the second semiconductor chip CG2 and the third semiconductor chip CG3 may have an area A that includes molding areas M1 and M4, chip areas M2 and M3 and heat discharge areas V1, V2, and V3. In the chip areas M2 and M3, the first semiconductor chip CH1 may overlap the second semiconductor chip CG2 and the third semiconductor chip CG3. Accordingly, the area A of the semiconductor package 10 may include a chip area M2 in which the first and second semiconductor chips CH1 and CG2 overlap in a vertical direction that extends perpendicular to an upper surface 102T of the wiring substrate 102 (e.g., the Z direction as shown in FIG. 2) and a heat discharge area (e.g., V1, V2, and/or V3) in which the first and second semiconductor chips CH1 and CG2 do not overlap each other in the vertical direction.

In the heat discharge areas V1, V2, and V3, the first semiconductor chip CH1 may not overlap the second semiconductor chip CG2 and the third semiconductor chip CG3. The second semiconductor chip CG2 and the third semiconductor chip CG3 may be provided in the chip areas M2 and M3, respectively. The thermal discharge layers 122a, 122b, and 122c are provided in the heat discharge areas V1, V2, and V3, respectively, and may easily discharge heat to the outside since the first semiconductor chip CH1 does not overlap the second semiconductor chip CG2 and the third semiconductor chip CG3 in the heat discharge areas V1, V2, and V3. Restated, a heat discharge area V1, V3, and/or V3 may include a mold via hole and a thermal discharge layer, as shown in FIG. 2.

The thermal discharge layers 122a, 122b, and 122c may include a material having high thermal conductivity. The thermal discharge layers 122a, 122b, and 122c may include a material having higher thermal conductivity than that of the mold layers 116a and 116b. The thermal discharge layers 122a, 122b, and 122c may be referred to as heat transfer layers or heat passage layers. The thermal discharge layers 122a, 122b, and 122c may include a conductive material, for example, a metal.

The thermal discharge layers 122a, 122b, and 122c may include any one selected from aluminum (Al), tin (Sn), copper (Cu), silver (Ag), nickel (Ni), aluminum oxide ($Al_2O_3$), zinc oxide (ZnO), silicon carbide (SiC), aluminum nitride (AlN), boron nitride (BN), diamond, and combinations thereof. The thermal discharge layers 122a, 122b, and 122c may have a higher thermal conductivity than the mold layers 116a and 116b. The thermal discharge layer 122b may overlap the heat source 110b. The thermal discharge layers 122a and 122c may not overlap the heat sources 110a and 110c.

Since the first semiconductor chip CH1 easily discharges heat through the intermediate layer 114, the electromagnetic shielding layers 120a and 120b, and the thermal discharge layers 122a, 122b, and 122c, the operation reliability of the first semiconductor chip CH1 may be improved. In addition, since heat generated in the first semiconductor chip CH1 is easily discharged through the intermediate layer 114, the electromagnetic shielding layers 120a and 120b, and the thermal discharge layers 122a, 122b, and 122c, the heat does not affect the second semiconductor chip CG2 and the third semiconductor chip CG3, and thus, the operation reliability of the second semiconductor chip CG2 and the third semiconductor chip CG3 may be improved.

Furthermore, since heat generated in the second semiconductor chip CG2 and the third semiconductor chip CG3 is also easily discharged to the outside through the intermediate layer 114, the electromagnetic shielding layers 120a and 120b, and the thermal discharge layers 122a, 122b, and 122c, the operation reliability of the second semiconductor chip CG2 and the third semiconductor chip CG3 may be improved.

As described above, the semiconductor package 10 may include the electromagnetic shielding layers 120a and 120b and thus the first semiconductor chip CH1, the second semiconductor chip CG2, and the third semiconductor chip CG3 may not be affected by electromagnetic waves. In other words, the semiconductor package 10 may include the electromagnetic shielding layers 120a and 120b and thus have good electromagnetic shielding characteristics.

In addition, since the semiconductor package 10 includes the intermediate layer 114, the mold via holes 118a, 118b, and 118c, and the thermal discharge layers 122a, 122b and 122c to easily discharge heat, the operation reliability of the first semiconductor chip CH1, the second semiconductor chip CG2, and the third semiconductor chip CG3 may be improved. In other words, the semiconductor package 10 may include the intermediate layer 114, the mold via holes 118a, 118b, and 118c, and the thermal discharge layers 122a, 122b and 122c and thus have excellent heat discharge characteristics.

Figure 3A:
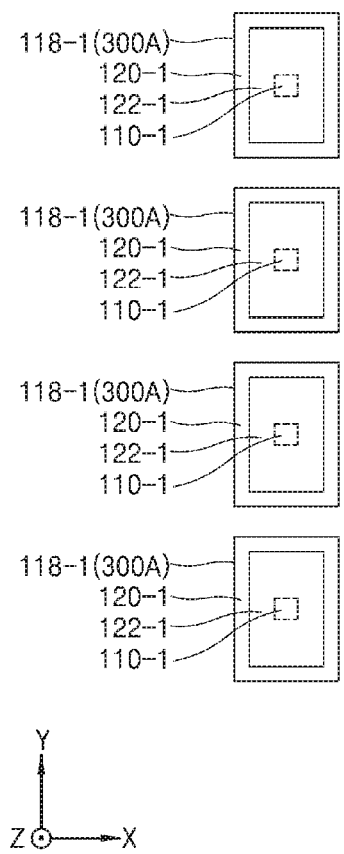
FIGS. 3A, 3B, and 3C are each a plan view illustrating various arrangements of a heat source, a mold via hole, an electromagnetic shielding layer, and a thermal discharge layer of the semiconductor package of FIGS. 1 and 2 according to some example embodiments of the inventive concepts.
Figure 3B:
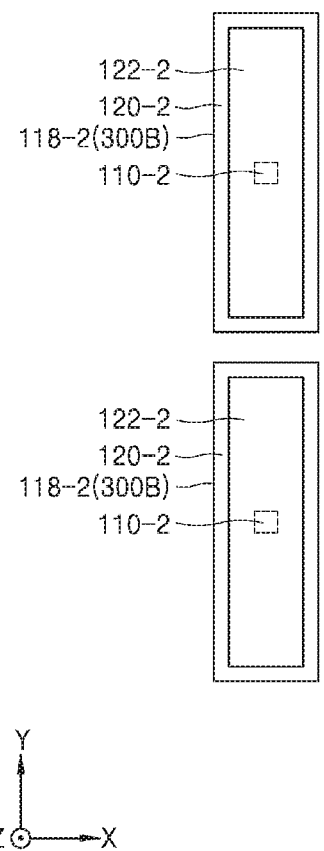
Figure 3C:
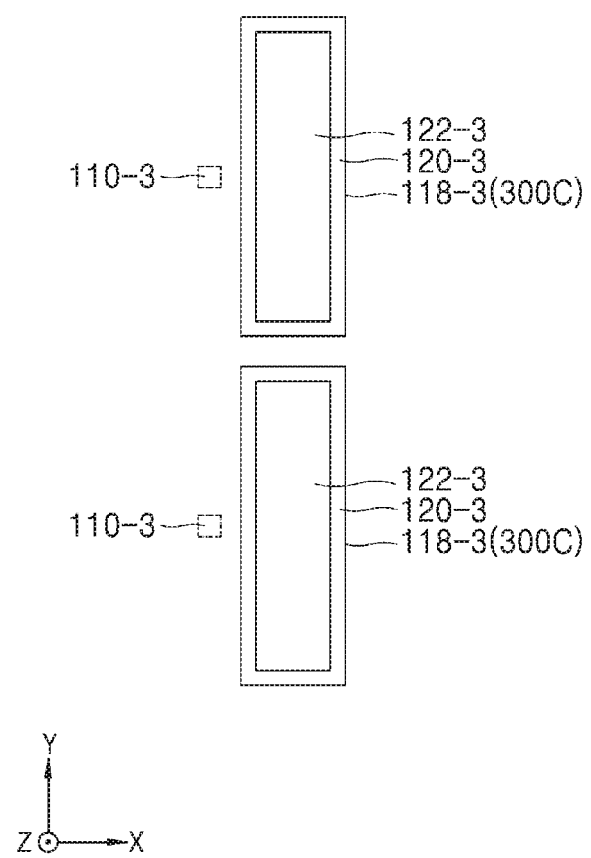

FIGS. 3A, 3B, and 3C are each a plan view illustrating various arrangements of a heat source, a mold via hole, an electromagnetic shielding layer, and a thermal discharge layer of the semiconductor package 10 of FIGS. 1 and 2.

Specifically, in the semiconductor package 10 of FIGS. 1 and 2, a mold via hole (see mold via holes 118a, 118b, and 118c in FIG. 1) is formed on the intermediate layer 114 as one mold via pattern extending in one direction, that is, the Y direction, as described above with reference to the plan view of FIG. 1. In addition, as shown in FIGS. 3A-3C, mold via holes 118-1, 118-2, and 118-3 may be arranged in various manners.

As shown in FIG. 3A, the mold via holes 118-1 are arranged as a plurality of mold via patterns 300A, that is, four mold via patterns 300A, extending in the Y direction and spaced apart from each other ("isolated from direct contact with each other"). An electromagnetic shielding layer 120-1 and a thermal discharge layer 122-1 are located in the mold via holes 118-1. A heat source 110-1 may be located to overlap the mold via holes 118-1.

As shown in FIG. 3B, the mold via holes 118-2 are arranged as a plurality of mold via patterns 300B, that is, two mold via patterns 300B, extending in the Y direction and spaced apart from each other. An electromagnetic shielding layer 120-2 and a thermal discharge layer 122-2 are located in the mold via holes 118-2. A heat source 110-2 may be located to overlap the mold via holes 118-2.

As shown in FIG. 3C, the mold via holes 118-3 are arranged as a plurality of mold via patterns 300C, that is, two mold via patterns 300C, extending in the Y direction and spaced apart from each other. An electromagnetic shielding layer 120-3 and a thermal discharge layer 122-3 are located in the mold via holes 118-3. A heat source 110-3 may be located so as not to overlap the mold via holes 118-3.

Figure 4:
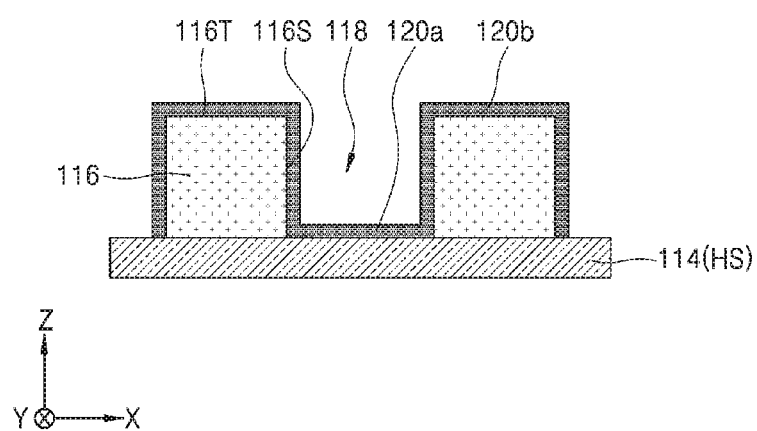
FIG. 4 is a cross-sectional view of a main portion of an electromagnetic shielding layer conformally formed on the inner wall of a mold via hole of the semiconductor package 10 of FIGS. 1 and 2 according to some example embodiments of the inventive concepts.

FIG. 4 is a cross-sectional view of a main portion of an electromagnetic shielding layer conformally formed on the inner wall of a mold via hole of the semiconductor package 10 of FIGS. 1 and 2.

Specifically, electromagnetic shielding layers 120a and 120b may be conformally formed on the inner wall of a mold via hole 118 and the surface of a mold layer 116 on an intermediate layer 114, as shown in FIG. 4. The electromagnetic shielding layer 120a may be formed on the inner wall of the mold via hole 118. The electromagnetic shielding layer 120b may be formed on the surface of the mold layer 116. The electromagnetic shielding layers 120a and 120b may protect semiconductor chips (i.e., the first to third semiconductor chips CH1, CG2, and CG3 in FIGS. 1 and 2) from electromagnetic waves.

Figure 5:
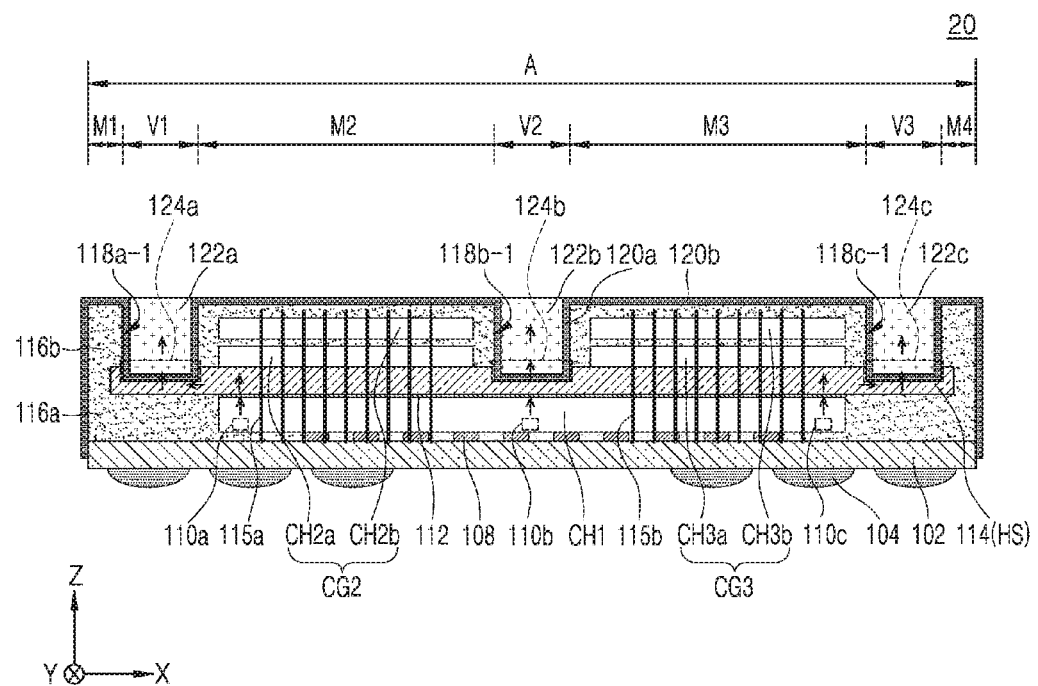
FIG. 5 is a cross-sectional view of a main portion of a semiconductor package according to some example embodiments of the inventive concepts.

FIG. 5 is a cross-sectional view of a main portion of a semiconductor package 20 according to some example embodiments of the inventive concepts.

Specifically, the semiconductor package 20 may be the same as the semiconductor package 10 of FIGS. 1 and 2, except that mold via holes 118a-1, 118b-1, and 118c-1 having recess portions 124a, 124b, and 124c, respectively, are formed in the semiconductor package 20. Accordingly, descriptions that are the same as those given above with reference to FIGS. 1 and 2 are briefly explained or omitted.

The semiconductor package 20 may include an intermediate layer 114 attached on a first semiconductor chip CH1. The intermediate layer 114 may be a heat spreader HS. The semiconductor package 20 may include the mold via holes 118a-1, 118b-1, and 118c-1 respectively having ("at least partially defined by") the recess portions 124a, 124b, and 124c recessed from the surface of the intermediate layer 114 and into the interior of the intermediate layer 114, as shown in FIG. 5 (see FIGS. 1 and 2).

In the semiconductor package 20, an electromagnetic shielding layer 120a may be formed in the mold via holes 118a-1, 118b-1, and 118c-1 having the recess portions 124a, 124b, and 124c formed therein and thus a second semiconductor chip CG2 and a third semiconductor chip CG3 may be well protected from electromagnetic waves.

In the semiconductor package 20, thermal discharge layers 122a, 122b, and 122c may be respectively formed in the mold via holes 118a-1, 118b-1, and 118c-1 respectively having the recess portions 124a, 124b, and 124c. The semiconductor package 20 may reduce a heat discharge path from the first semiconductor chip CH1 to the thermal discharge layers 122a, 122b, and 122c and thus heat generated in the first semiconductor chip CH1 may be easily discharged through the thermal discharge layers 122a, 122b, and 122c.

Figure 6:
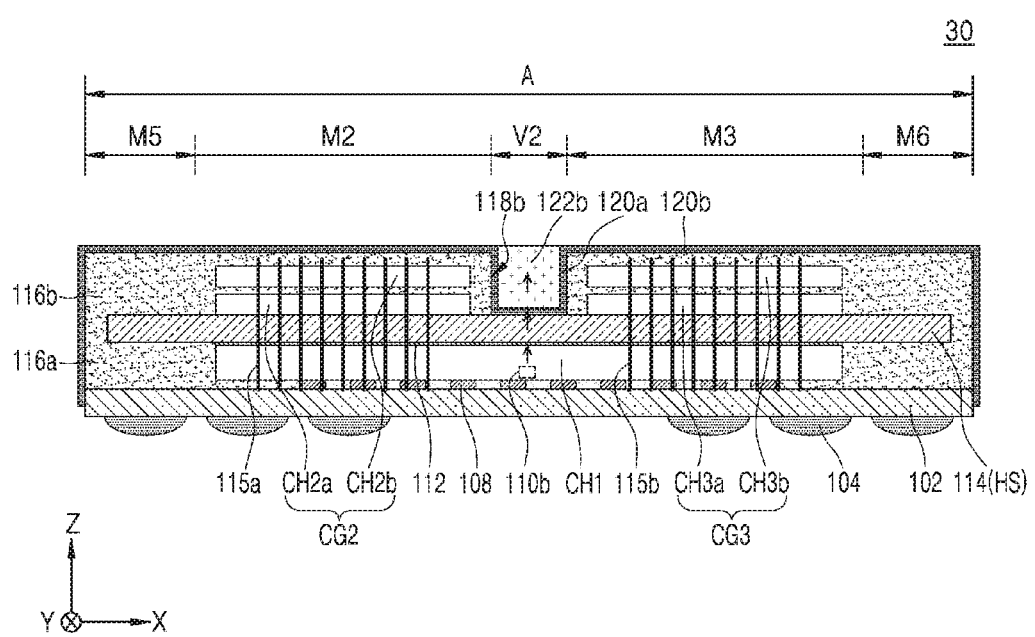
FIG. 6 is a cross-sectional view of a main portion of a semiconductor package according to some example embodiments of the inventive concepts.

FIG. 6 is a cross-sectional view of a main portion of a semiconductor package 30 according to some example embodiments of the inventive concepts. As shown in FIG. 6, the area A of the semiconductor package 30 includes chip areas M2 and M3, molding areas M5 and M6, and heat discharge area V2.

Specifically, the semiconductor package 30 may be the same as the semiconductor package 10 of FIGS. 1 and 2, except that a mold via hole 118b and a thermal discharge layer 122b are formed between a second semiconductor chip CG2 and a third semiconductor chip CG3 on an intermediate layer 114. Accordingly, descriptions that are the same as those given above with reference to FIGS. 1 and 2 are briefly explained or omitted.

The mold via hole 118b may be formed in a mold layer 116b on the intermediate layer 114 in the semiconductor package 30. The mold via hole 118b may expose a portion of the surface of the intermediate layer 114. The mold via hole 118b may be located between the second semiconductor chip CG2 and the third semiconductor chip CG3 on the intermediate layer 114. An electromagnetic shielding layer 120a may be formed in the mold via hole 118b. An electromagnetic shielding layer 120b may be formed on the surfaces of mold layers 116a and 116b. The thermal discharge layer 122b may be formed on the electromagnetic shielding layer 120a in the mold via hole 118b.

The semiconductor package 30 may protect a first semiconductor chip CH1, the second semiconductor chip CG2, and the third semiconductor chip CG3 from electromagnetic waves via the electromagnetic shielding layers 120a and 120b. When a heat source 110b is present in the central portion of the first semiconductor chip CH1, the semiconductor package 30 may easily discharge heat to the outside through the intermediate layer 114, the electromagnetic shielding layer 120a, and the thermal discharge layer 122b above the heat source 110b.

Figure 7:
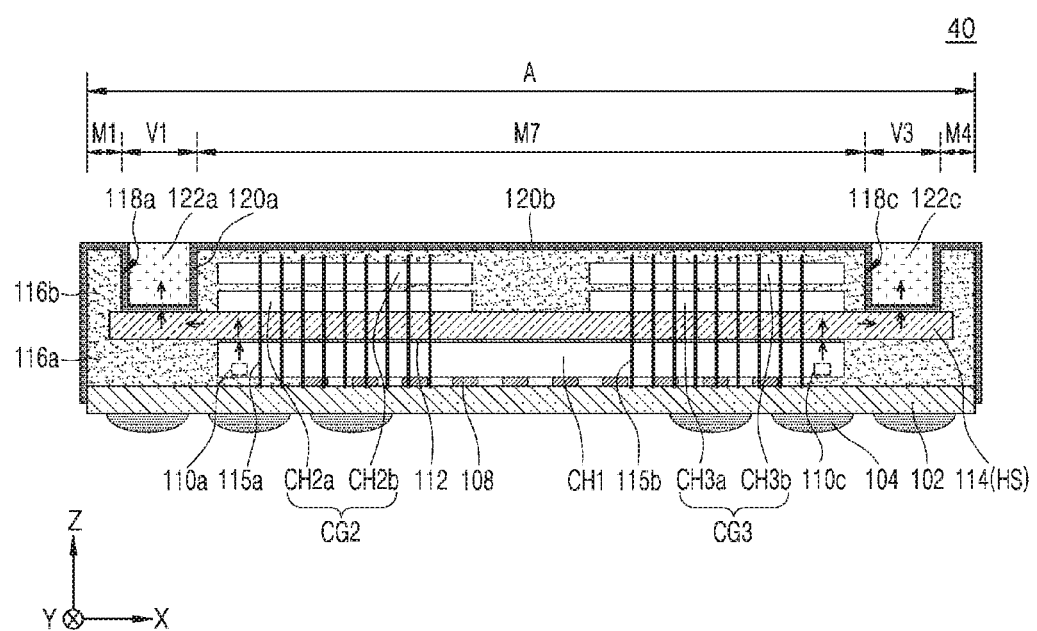
FIG. 7 is a cross-sectional view of a main portion of a semiconductor package according to some example embodiments of the inventive concepts.

FIG. 7 is a cross-sectional view of a main portion of a semiconductor package 40 according to some example embodiments of the inventive concepts. As shown in FIG. 7, the area A of the semiconductor package 30 includes molding areas M1 and M4, chip area M7, and heat discharge areas V1 and V3.

Specifically, the semiconductor package 40 may be the same as the semiconductor package 10 of FIGS. 1 and 2, except that mold via holes 118a and 118c and thermal discharge layers 122a and 122c are formed in an edge portion of an intermediate layer 114. Accordingly, descriptions that are the same as those given above with reference to FIGS. 1 and 2 are briefly explained or omitted.

The semiconductor package 40 may have the mold via holes 118a and 118c formed in a mold layer 116b on the intermediate layer 114. The mold via holes 118a and 118c may expose a portion of the surface of the intermediate layer 114. The mold via hole 118a may be formed in an edge portion of the intermediate layer 114 spaced apart from one side of a second semiconductor chip CG2. The mold via hole 118c may be formed in an edge portion of the intermediate layer 114 separated from one side of a third semiconductor chip CG3.

An electromagnetic shielding layer 120a may be formed inside the mold via holes 118a and 118c. An electromagnetic shielding layer 120b may be formed on the surfaces of the mold layers 116a and 116b. The thermal discharge layer 122a may be formed on the electromagnetic shielding layer 120a in the mold via hole 118a. The thermal discharge layer 122c may be formed on the electromagnetic shielding layer 120a in the mold via hole 118c.

The semiconductor package 40 may protect a first semiconductor chip CH1, the second semiconductor chip CG2, and the third semiconductor chip CG3 from electromagnetic waves via the electromagnetic shielding layers 120a and 120b. When heat sources 110a and 110c are present in an edge portion of the first semiconductor chip CH1, the semiconductor package 40 may easily discharge heat to the outside through the intermediate layer 114, the electromagnetic shielding layers 120a and 120b, and the thermal discharge layers 122a and 122c above the heat sources 110a and 110c.

Figure 8:
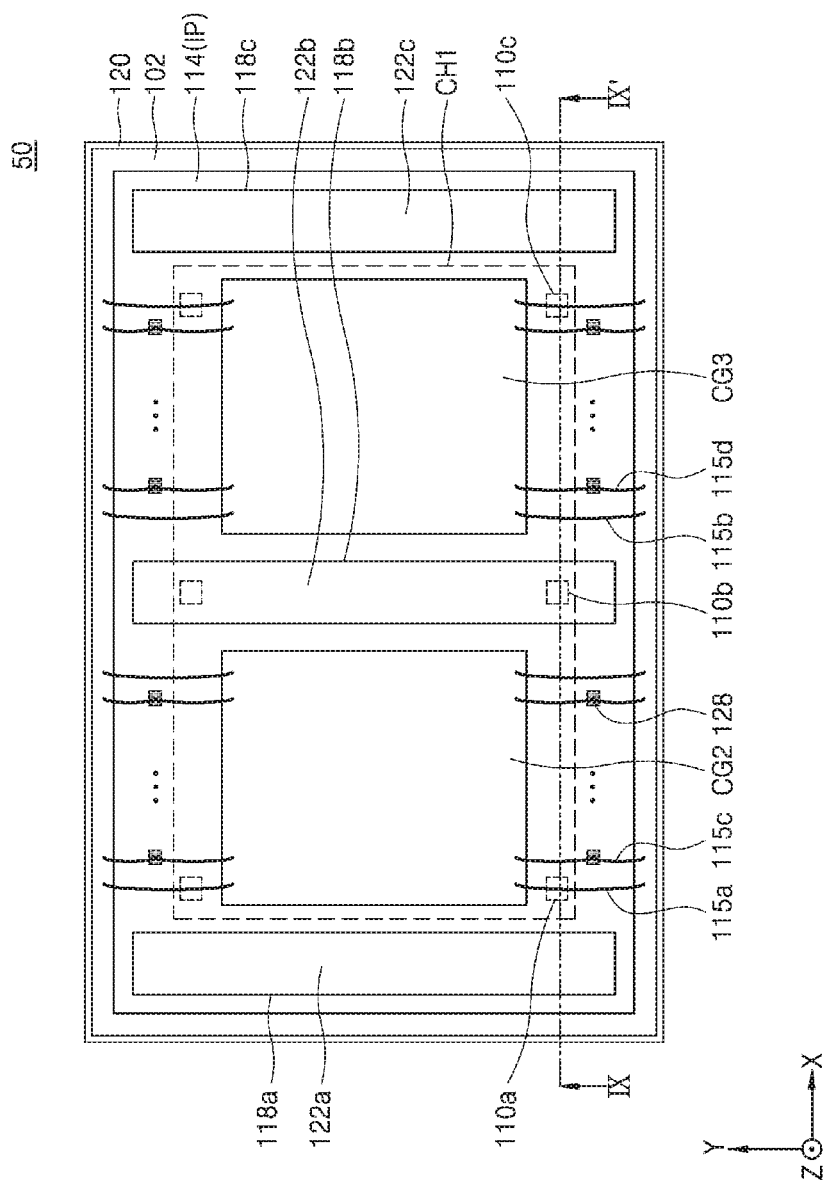
FIG. 8 is a plan view of a semiconductor package according to some example embodiments of the inventive concepts.
Figure 9:
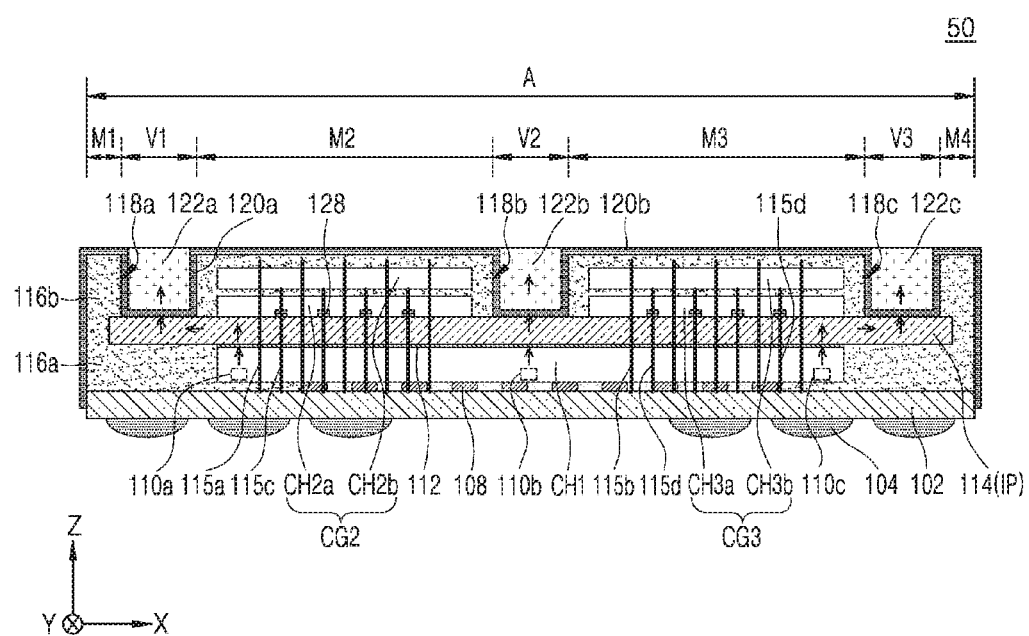
FIG. 9 is a cross-sectional view along view line IX-IX' of a main portion of the semiconductor package of FIG. 8 according to some example embodiments of the inventive concepts.

FIG. 8 is a plan view of a semiconductor package 50 according to some example embodiments of the inventive concepts, and FIG. 9 is a cross-sectional view, along view line IX-IX', of a main portion of the semiconductor package 50 of FIG. 8.

Specifically, FIG. 9 is a cross-sectional view of a main portion taken along a line IX-IX' in FIG. 8. The semiconductor package 50 may be the same as the semiconductor package 10 of FIGS. 1 and 2, except that an intermediate layer 114 in the semiconductor package 50 includes an interposer chip IP and an electrical connection relationship between second and third semiconductor chips CG2 and CG3 and a wiring substrate 102 in the semiconductor package 50 is different from that between the second and third semiconductor chips CG2 and CG3 and the wiring substrate 102 in the semiconductor package 10. Accordingly, descriptions that are the same as those given with reference to FIGS. 1 and 2 are briefly described or omitted.

In the semiconductor package 50, the first semiconductor chip CH1 may be attached to the wiring substrate 102. The intermediate layer 114 may be mounted on the first semiconductor chip CH1. The intermediate layer 114 may cover the entire surface of the first semiconductor chip CH1. The intermediate layer 114 may be the interposer chip IP. The interposer chip IP may disperse heat generated in the first semiconductor chip CH1.

The interposer chip IP may include a silicon substrate. The interposer chip IP does not include an active element, for example, a transistor, and may include only an inner wiring layer on the surface and in the inside of the silicon substrate. A connection pad 128 may be located on the surface of the intermediate layer 114 including the interposer chip IP.

The second semiconductor chip CG2 may be a multilayer chip in which a plurality of sub-chips CH2a and CH2b are sequentially stacked on the intermediate layer 114 including the interposer chip IP. The sub-chip CH2b may be electrically connected to the wiring substrate 102 by a bonding wire 115a. The sub-chip CH2a may be electrically connected to the wiring substrate 102 by a bonding wire 115c via the connection pad 128 on the intermediate layer 114.

The third semiconductor chip CG3 may be a multilayer chip in which a plurality of sub-chips CH3a and CH3b are sequentially stacked on the intermediate layer 114. The sub-chip CH3b may be electrically connected to the wiring substrate 102 by a bonding wire 115b. The sub-chip CH3a may be electrically connected to the wiring substrate 102 by a bonding wire 115d via the connection pad 128 on the intermediate layer 114.

Accordingly, as shown in FIGS. 8-9, each semiconductor chip of the second and third semiconductor chips CG2 and CG3 may be electrically connected to the wiring substrate 102 via an interposer chip IP of an intermediate layer 114.

The semiconductor package 50 may include electromagnetic shielding layers 120a and 120b to protect the first semiconductor chip CH1, the second semiconductor chip CG2, and the third semiconductor chip CG3 from electromagnetic waves. The semiconductor package 50 may include thermal discharge layers 122a, 122b, and 122c in mold via holes 118a, 118b, and 118c and discharge heat generated in the first semiconductor chip CH1 to the outside without transmitting the heat to the second semiconductor chip CG2 and the third semiconductor chip CG3.

In addition, since the intermediate layer 114 in the semiconductor package 50 includes the interposer chip IP, the second semiconductor chip CG2 and the third semiconductor chip CG3 may be easily connected to the wiring substrate 102. In the semiconductor package 50, circuits related to the first semiconductor chip CH1, the second semiconductor chip CG2, and the third semiconductor chip CG3 may be freely designed on the wiring substrate 102.

Figure 10:
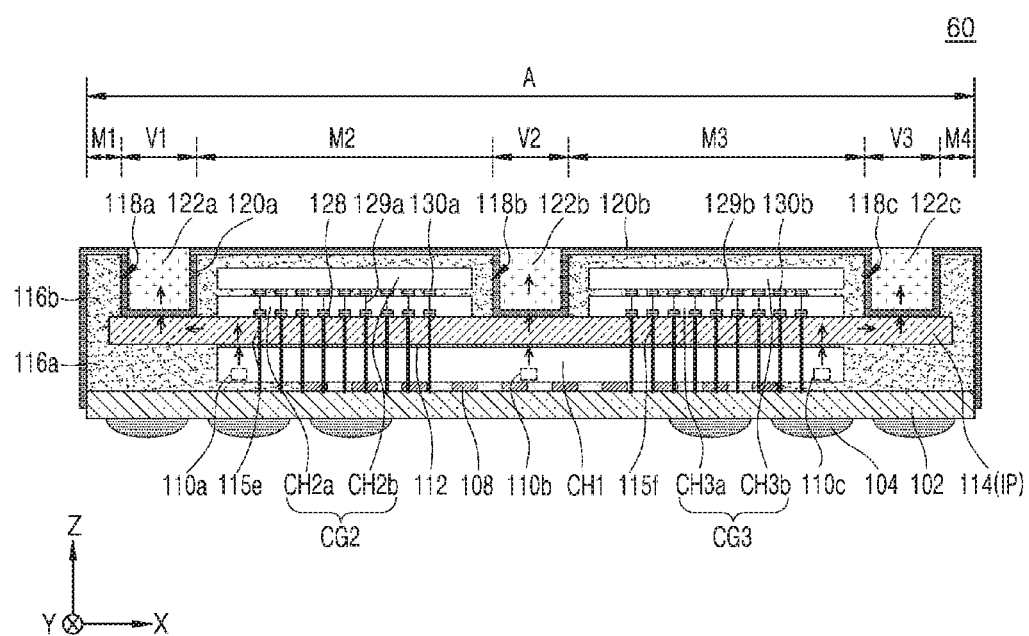
FIG. 10 is a cross-sectional view of a semiconductor package according to some example embodiments of the inventive concepts.

FIG. 10 is a cross-sectional view of a semiconductor package 60 according to some example embodiments of the inventive concepts.

Specifically, the semiconductor package 60 may be the same as the semiconductor package 10 of FIGS. 1 and 2, except that an intermediate layer 114 in the semiconductor package 60 includes an interposer chip IP and an electrical connection relationship between second and third semiconductor chips CG2 and CG3 and a wiring substrate 102 in the semiconductor package 60 is different from that between the second and third semiconductor chips CG2 and CG3 and the wiring substrate 102 in the semiconductor package 10.

The semiconductor package 60 may be the same as the semiconductor package 50 of FIGS. 8 and 9, except that the electrical connection relationship between the second and third semiconductor chips CG2 and CG3 and the wiring substrate 102 in the semiconductor package 60 is different from that between the second and third semiconductor chips CG2 and CG3 and the wiring substrate 102 in the semiconductor package 50. Accordingly, descriptions that are the same as those given with reference to FIGS. 1, 2, 8, and 9 are briefly described or omitted.

In the semiconductor package 60, a first semiconductor chip CH1 may be attached on the wiring substrate 102. The intermediate layer 114 may be mounted on the first semiconductor chip CH1. The intermediate layer 114 may be an interposer chip IP. The interposer chip IP may include a silicon substrate and may include an inner wiring layer on the surface and in the inside of the silicon substrate. A connection pad 128 may be located on the surface of the intermediate layer 114 including the interposer chip IP.

The second semiconductor chip CG2 may be a multilayer chip in which a plurality of sub-chips CH2a and CH2b are sequentially stacked on the intermediate layer 114 including the interposer chip IP. The sub-chips CH2a and CH2b may be located such that active surfaces thereof face each other, and a chip pad 130a connecting the sub-chips CH2a and CH2b to each other may be formed between the sub-chips CH2a and CH2b.

The sub-chip CH2b may be electrically connected to the connection pad 128 through a through via 129a formed in the sub-chip CH2a. Accordingly, the plurality of sub-chips CH2a and CH2b of the second semiconductor chip CG2 are electrically connected to each other via one or more through vias 129a. The sub-chip CH2a may be electrically connected to the wiring substrate 102 by a bonding wire 115e that is connected to the connection pad 128 on the intermediate layer 114.

The third semiconductor chip CG3 may be a multilayer chip in which a plurality of sub-chips CH3a and CH3b are sequentially stacked on the intermediate layer 114. The sub-chips CH3a and CH3b may be located such that active surfaces thereof face each other, a chip pad 130b connecting the sub-chips CH3a and CH3b to each other may be formed between the sub-chips CH3a and CH3b.

The sub-chip CH3b may be electrically connected to the connection pad 128 through a through via 129b formed in the sub-chip CH3a. Accordingly, the plurality of sub-chips CH3a and CH3b of the third semiconductor chip CG3 are electrically connected to each other via one or more through vias 129b. The sub-chip CH3a may be electrically connected to the wiring substrate 102 by a bonding wire 115f that is connected to the connection pad 128 on the intermediate layer 114.

Accordingly, as shown in FIG. 10, each semiconductor chip of the second and third semiconductor chips CG2 and CG3 may be electrically connected to the wiring substrate 102 via a separate bonding wire, via the interposer chip IP of the intermediate layer 114.

In the semiconductor package 60, the sub-chips CH2a and CH3a may be directly connected to the sub-chips CH2b and CH3b through the chip pads 130a and 130b, respectively, and the chip pads 130a and 130b on the interposer chip IP forming the intermediate layer 114 may be easily connected to the wiring substrate 102 by using bonding wires. Thus, in the semiconductor package 60, circuits related to the first semiconductor chip CH1, the second semiconductor chip CG2, and the third semiconductor chip CG3 may be freely designed on the wiring substrate 102.

FIGS. 11, 12, 13, and 14 are cross-sectional views illustrating a method of manufacturing a semiconductor package, according to some example embodiments of the inventive concepts.

Specifically, FIGS. 11 to 14 are provided for explaining a method of manufacturing the semiconductor package 10 of FIGS. 1 and 2. In FIGS. 11 to 14, reference numerals that are the same as those in FIGS. 1 and 2 denote members that are the same as those in FIGS. 1 and 2, and thus, descriptions that are the same as those given with reference to FIGS. 1 and 2 are briefly described or omitted.

Figure 11:
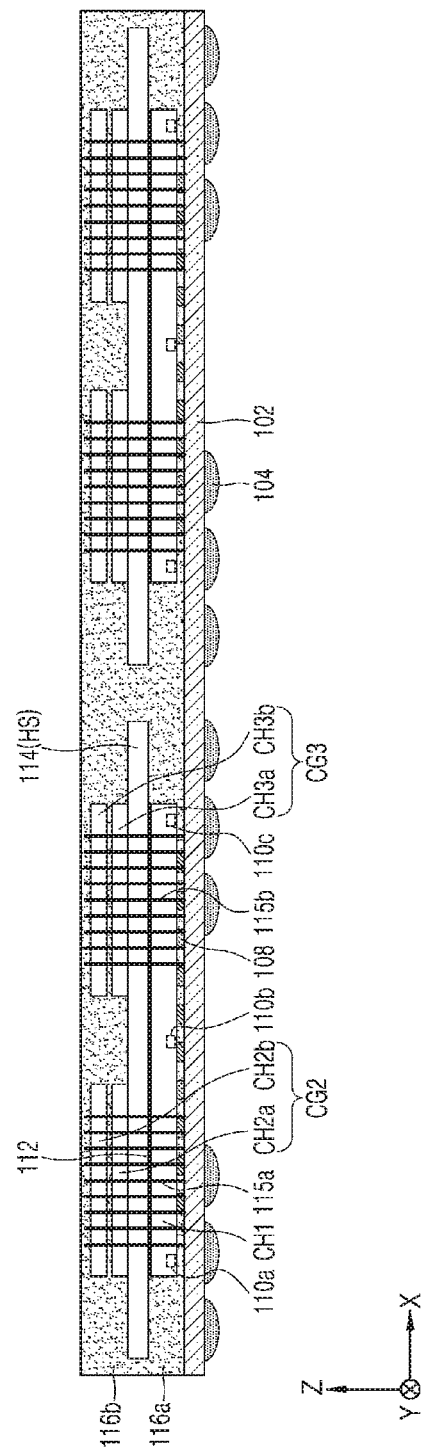
FIGS. 11, 12, 13, and 14 are cross-sectional views illustrating a method of manufacturing a semiconductor package, according to some example embodiments of the inventive concepts.

Referring to FIG. 11, a first semiconductor chip CH1 is attached on a wiring substrate 102 having external terminals 104 formed on a lower surface thereof. The wiring substrate 102 and the first semiconductor chip CH1 are electrically connected to each other by using a connection bump 108. A plurality of first semiconductor chips CH1 may be attached on the wiring substrate 102. For convenience, only two first semiconductor chips CH1 are illustrated in FIG. 11. The first semiconductor chips CH1 are located apart from each other.

Each of the first semiconductor chips CH1 may be a logic chip. The first semiconductor chip CH1 may include heat sources 110a, 110b, and 110c. The heat sources 110a, 110b, and 110c may be located in both edge portions and a central portion of the first semiconductor chip CH1 in a sectional view. The heat sources 110a, 110b, and 110c may be formed at various positions according to a chip design.

An intermediate layer 114 is attached on the first semiconductor chip CH1 by using an adhesive layer 112. In other words, intermediate layers 114 are attached on the first semiconductor chips CH1 by using the adhesive layer 112. Each of the intermediate layers 114 may be a heat spreader HS. The intermediate layers 114 are apart from each other.

A second semiconductor chip CG2 and a third semiconductor chip CG3 are attached on each of the intermediate layers 114. On the intermediate layer 114, the second semiconductor chip CG2 and the third semiconductor chip CG3 are located apart from each other. The second semiconductor chip CG2 and the third semiconductor chip CG3 may be memory chips.

The second semiconductor chip CG2 may include a multilayer chip in which a plurality of sub-chips CH2a and CH2b are sequentially stacked. The third semiconductor chip CG3 includes a multilayer chip in which a plurality of sub-chips CH3a and CH3b are sequentially stacked. The second semiconductor chip CG2 and the third semiconductor chip CG3 may be different types of chips than the first semiconductor chip CH1.

The second semiconductor chip CG2 and the third semiconductor chip CG3 are electrically connected to the wiring substrate 102 by using a bonding wire 115a and a bonding wire 115b, respectively.

Mold layers 116a and 116b are formed on the wiring substrate 102 to sufficiently cover the first semiconductor chip CH1, the second semiconductor chip CG2, and the third semiconductor chip CG3. The mold layer 116a is formed on the wiring substrate 102 and under the intermediate layer 114. The mold layer 116b is formed on the top and side walls of the intermediate layer 114. The mold layers 116a and 116b may include an insulating polymer such as an epoxy molding compound.

Figure 12:
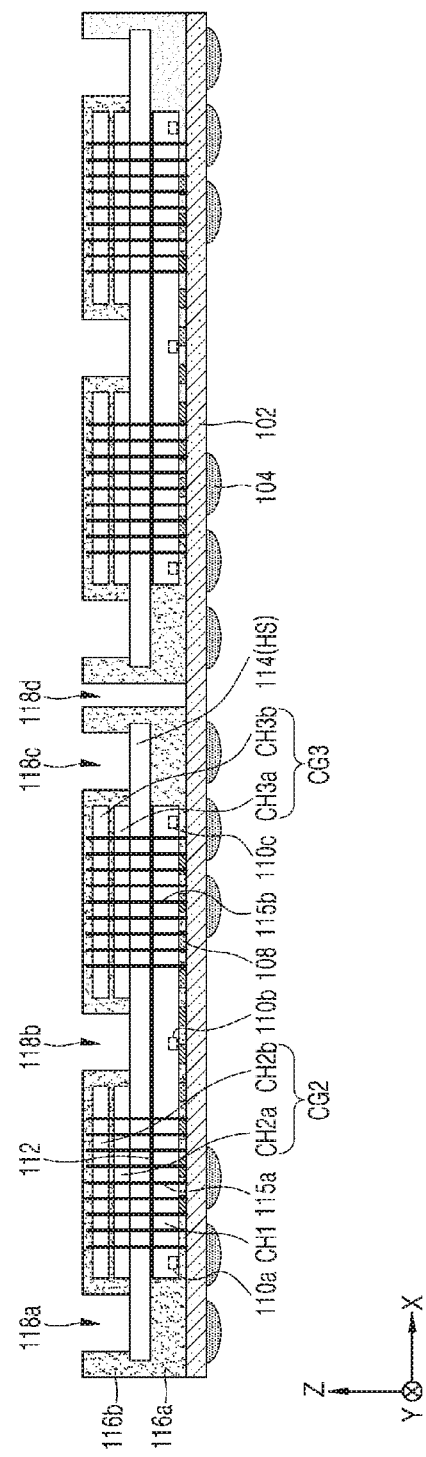

Referring to FIG. 12, the mold layer 116b located on the intermediate layer 114 is laser-machined to form mold via holes 118a, 118b, and 118c exposing the surface of the intermediate layer 114. The mold via holes 118a, 118b, and 118c may be apart from each other on the intermediate layer 114.

The mold via holes 118a and 118c are formed in an edge portion of the intermediate layer 114 spaced apart from one side of the second semiconductor chip CG2 and an edge portion of the intermediate layer 114 spaced apart from one side of the third semiconductor chip CG3. The mold via holes 118a and 118c correspond to the heat sources 110a and 110c and are formed at areas adjacent thereto. The mold via hole 118b is formed on the intermediate layer 114 between the second semiconductor chip CG2 and the third semiconductor chip CG3. The mold via hole 118b corresponds to the heat source 110b and is formed to overlap the heat source 110b.

When the mold via holes 118a, 118b, and 118c are formed or after the mold via holes 118a, 118b, and 118c are formed, the mold layers 116a and 116b between the intermediate layers 114 are laser-machined to thereby form a mold separation via hole 118d exposing the wiring substrate 102. The mold separation via hole 118d separates the intermediate layers 114 from each other.

Figure 13:
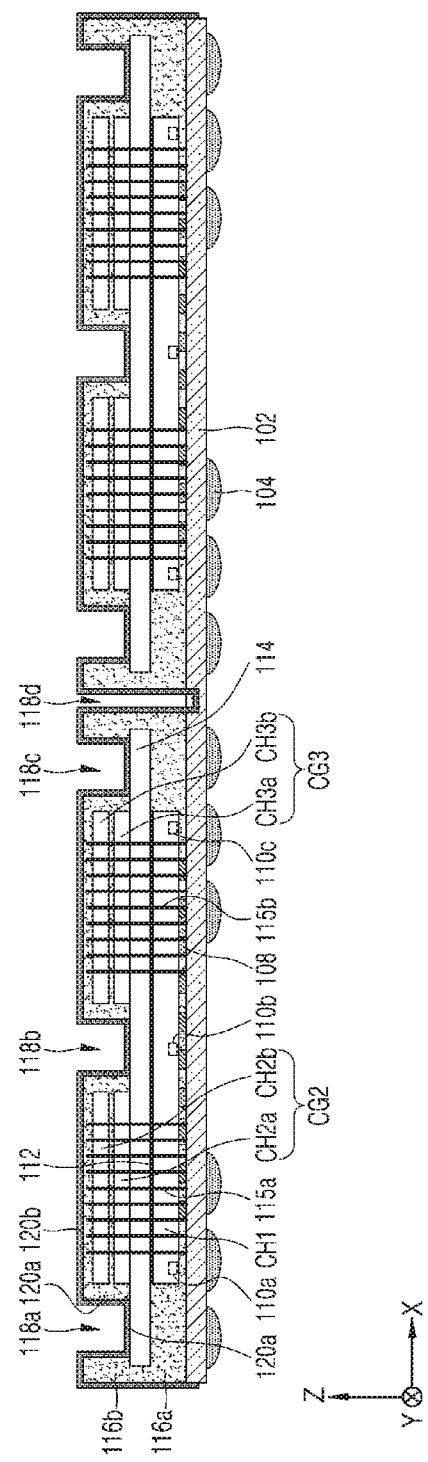

Referring to FIG. 13, electromagnetic shielding layers 120a and 120b are formed conformally (with a constant thickness) on the inner walls of the mold via holes 118a, 118b, and 118c and the mold separation via hole 118d and on the surface and side walls of the mold layers 116a and 116b. The electromagnetic shielding layer 120a may be formed conformally (with a constant thickness) in the insides of the mold via holes 118a, 118b, and 118c and the mold separation via hole 118d, that is, on the bottoms and inner walls of the mold via holes 118a, 118b, and 118c and the mold separation via hole 118d.

The electromagnetic shielding layer 120b may be conformally formed on the surfaces or both sidewalls of the mold layers 116a and 116b. The electromagnetic shielding layers 120a and 120b may be formed so that the first semiconductor chip CH1, the second semiconductor chip CG2, and the third semiconductor chip CG3 are not damaged or obstructed by electromagnetic waves.

The electromagnetic shielding layers 120a and 120b may include a material including a conductor and a magnetic material. The electromagnetic shielding layers 120a and 120b may be formed by dispersing a magnetic material in a metallic material. The electromagnetic shielding layers 120a and 120b may be formed by compressing or spray-coating a layer of electromagnetic shielding material on the mold layers 116a and 116b.

Figure 14:
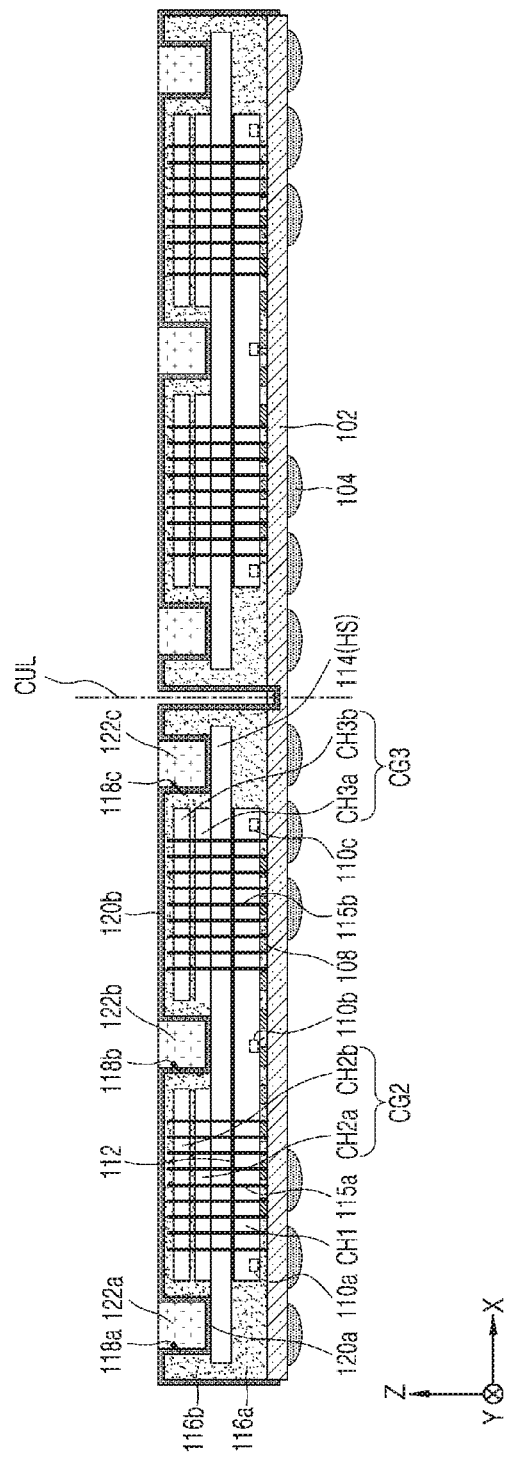

Referring to FIG. 14, thermal discharge layers 122a, 122b, and 122c are formed to fill the mold via holes 118a, 118b, and 118c on the electromagnetic shielding layer 120a in the mold via holes 118a, 118b, and 118c. The thermal discharge layers 122a, 122b, and 122c include a material having a high thermal conductivity.

The thermal discharge layers 122a, 122b, and 122c include a conductive material, for example, a metal. The thermal discharge layers 122a, 122b, and 122c may be formed by embedding a conductive material, such as a metal paste or a metal powder, in the mold via holes 118a, 118b, and 118c and then sintering the conductive material.

Subsequently, the electromagnetic shielding layer 120b, formed between the intermediate layers 114 and on the bottom of the mold separation via hole 118d, and the wiring substrate 102 are cut along a cutting line CUL to complete the semiconductor package 10 shown in FIG. 2.

Figure 15:
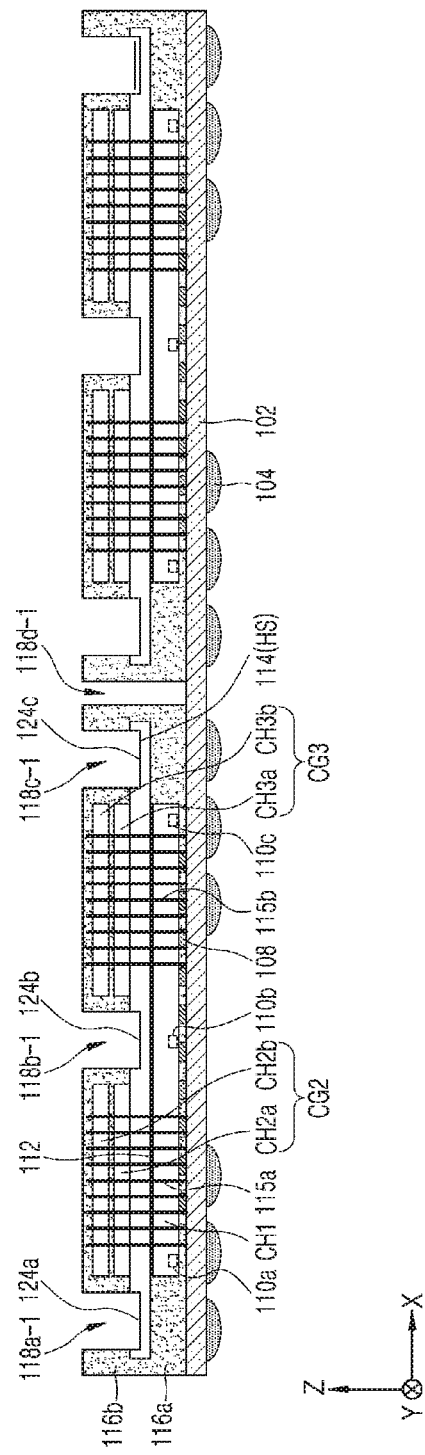
FIGS. 15, 16, and 17 are cross-sectional views illustrating a method of manufacturing a semiconductor package, according to some example embodiments of the inventive concepts.
Figure 16:
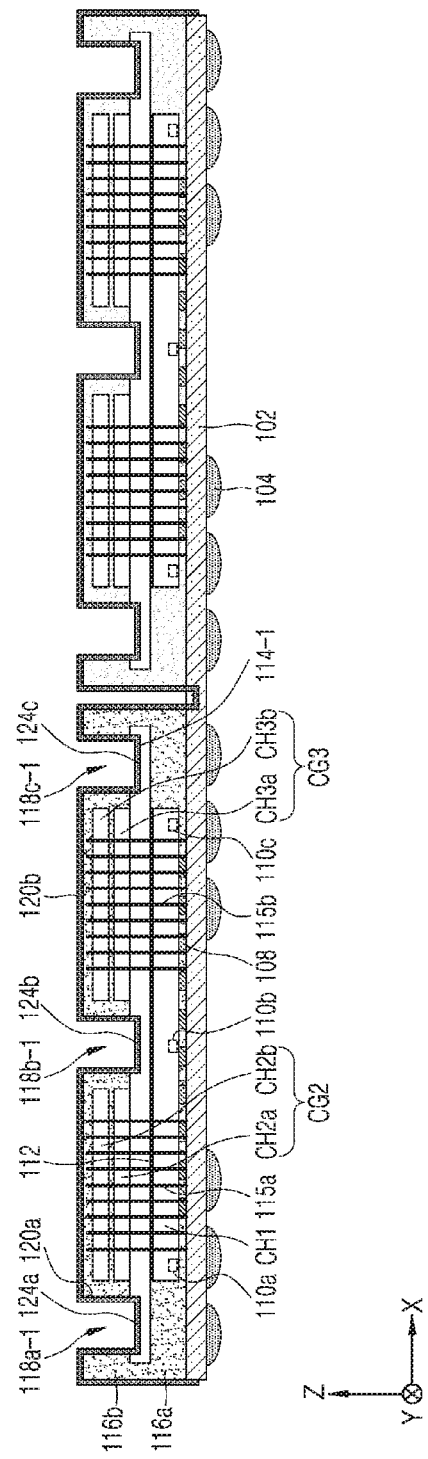
Figure 17:
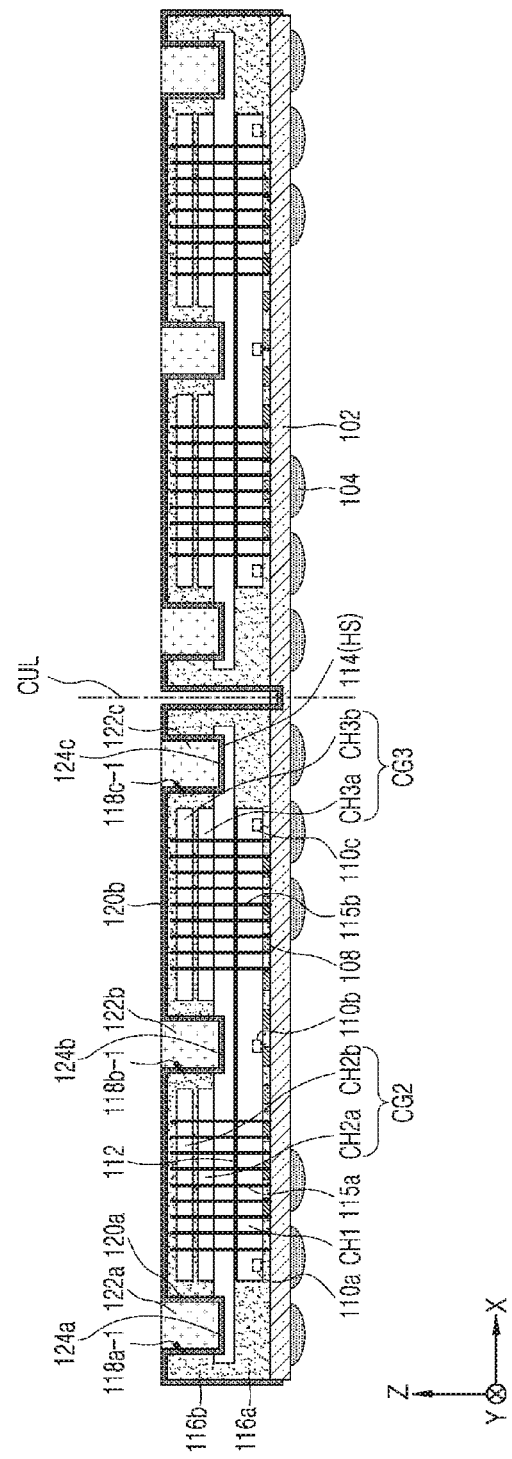

FIGS. 15, 16, and 17 are cross-sectional views illustrating a method of manufacturing a semiconductor package, according to some example embodiments of the inventive concepts.

Specifically, FIGS. 15 to 17 are provided for explaining a method of manufacturing the semiconductor package 20 of FIG. 5. In FIGS. 15 to 17, reference numerals that are the same as those in FIGS. 11 to 14 denote members that are the same as those in FIGS. 11 to 14, and thus, descriptions that are the same as those given with reference to FIGS. 11 to 14 are briefly described or omitted.

First, the processes described with reference to FIG. 11 are performed. Thus, first semiconductor chips CH1 electrically connected to a wiring substrate 102 having external terminals 104 formed on a lower surface thereof is attached on the wiring substrate 102. Intermediate layers 114 are attached on the first semiconductor chips CH1 by using an adhesive layer 112.

A second semiconductor chip CG2 and a third semiconductor chip CG3 are attached on each of the intermediate layers 114. The second semiconductor chip CG2 and the third semiconductor chip CG3 are electrically connected to the wiring substrate 102 by using a bonding wire 115a and a bonding wire 115b, respectively. Mold layers 116a and 116b are formed on the wiring substrate 102 to sufficiently cover the first semiconductor chip CH1, the second semiconductor chip CG2, and the third semiconductor chip CG3.

Referring to FIG. 15, the mold layer 116b located on the intermediate layer 114 is bladed to form mold via holes 118a-1, 118b-1, and 118c-1 exposing the surface of the intermediate layer 114. Recess portions 124a, 124b, and 124c recessed from the surface of the intermediate layer 114 may be formed at the bottoms of the mold via holes 118a, 118b-1, and 118c-1.

The mold via holes 118a-1, 118b-1, and 118c-1 may be apart from each other on the intermediate layer 114. The mold via holes 118a-1 and 118c-1 correspond to heat sources 110a and 110c and are formed at areas adjacent thereto. The mold via hole 118b-1 is formed on the intermediate layer 114 between the second semiconductor chip CG2 and the third semiconductor chip CG3. The mold via hole 118b-1 corresponds to a heat source 110b and is formed to overlap the heat source 110b.

When the mold via holes 118a-1, 118b-1, and 118c-1 are formed or after the mold via holes 118a-1, 118b-1, and 118c-1 are formed, the mold layers 116a and 116b between intermediate layers 114 are blade-machined to thereby form a mold separation via hole 118d-1 exposing the wiring substrate 102. The mold separation via hole 118d-1 separates the intermediate layers 114 from each other.

Referring to FIG. 16, electromagnetic shielding layers 120a and 120b are formed conformally (with a constant thickness) on the inner walls of the mold via holes 118a-1, 118b-1, and 118c-1, the inner wall of the mold separation via hole 118d-1, and the surface and side walls of the mold layers 116a and 116b.

The electromagnetic shielding layer 120a may be formed conformally (with a constant thickness) in the insides of the mold via holes 118a-1, 118b-1, and 118c-1 and the mold separation via hole 118d-1, that is, on the bottoms and inner walls of the mold via holes 118a-1, 118b-1, and 118c-1 and the mold separation via hole 118d-1.

The electromagnetic shielding layer 120b may be conformally formed on the surfaces or both sidewalls of the mold layers 116a and 116b. The electromagnetic shielding layers 120a and 120b may be formed by compressing or spray-coating a layer of electromagnetic shielding material on the mold layers 116a and 116b.

Referring to FIG. 17, thermal discharge layers 122a, 122b, and 122c are formed to fill the mold via holes 118a-1, 118b-1, and 118c-1 on the electromagnetic shielding layer 120a in the mold via holes 118a-1, 118b-1, and 118c-1 respectively having the recess portions 124a, 124b, and 124c. The thermal discharge layers 122a, 122b, and 122c include a material having a high thermal conductivity. Subsequently, the electromagnetic shielding layer 120b, formed between the intermediate layers 114 and on the bottom of the mold separation via hole 118d-1, and the wiring substrate 102 are cut along a cutting line CUL to complete the semiconductor package 20 shown in FIG. 5.

Figure 18:
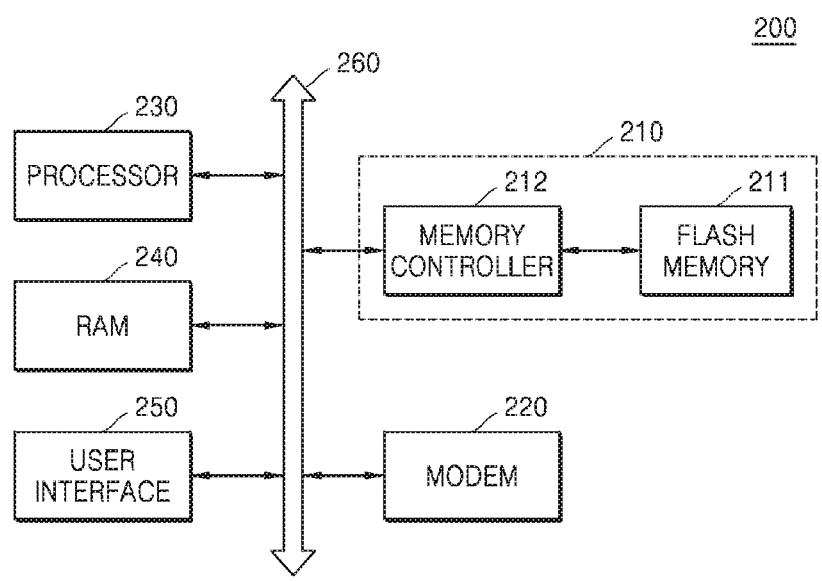
FIG. 18 is a block diagram of an electronic system including a semiconductor package according to some example embodiments of the inventive concepts.

FIG. 18 is a block diagram of an electronic system 200 including a semiconductor package according to some example embodiments of the inventive concepts.

Specifically, the electronic system 200 may be implemented as a mobile system, a personal computer, an industrial computer, or a logic system that performs various functions. For example, the mobile system may be a personal digital assistant (PDA), a portable computer, a web tablet, a mobile phone, a wireless phone, a laptop computer, a memory card, a digital music system, or an information transmission/reception system.

The electronic system 200 may include various devices, that is, a processor 230, random access memory (RAM) 240, a user interface 250, a modem 220, and a storage device 210, which communicate with each other via a common bus 260. Each of the devices transmits a signal to a storage device 210 via the common bus 260 and receives a signal from the storage device 210 via the common bus 260. The processor 230 may include at least one of a microprocessor, a digital signal processor, a microcontroller, and logic elements capable of performing the same function as the microprocessor, the digital signal processor, or the microcontroller.

The storage device 210 may include a flash memory 211 and a memory controller 212. The flash memory 211 may store data and may have non-volatile characteristics for maintaining the stored data even if power supply is interrupted. The storage device 210, the modem 220, and the processor 230 may include at least one of the semiconductor packages 10 to 60 described above.

While the inventive concepts have been particularly shown and described with reference to embodiments thereof, it will be understood that various changes in form and details may be made therein without departing from the spirit and scope of the following claims.

What is claimed is:

1. A semiconductor package, comprising:
   a first semiconductor chip on a wiring substrate, the first semiconductor chip electrically connected to the wiring substrate;
   an intermediate layer on the first semiconductor chip, the intermediate layer covering an entire surface of the first semiconductor chip;
   a second semiconductor chip on the intermediate layer, the second semiconductor chip electrically connected to the wiring substrate;
   a mold layer on the wiring substrate, the mold layer covering the first semiconductor chip and the second semiconductor chip, the mold layer including one or more inner surfaces at least partially defining a mold via hole that exposes a portion of a surface of the intermediate layer;
   an electromagnetic shielding layer on the one or more inner surfaces of the mold layer, the electromagnetic shielding layer further on one or more outer surfaces of the mold layer; and
   a thermal discharge layer on the electromagnetic shielding layer in the mold via hole, such that the thermal discharge layer fills the mold via hole.

2. The semiconductor package of claim 1, wherein
   the first semiconductor chip includes a heat source,
   the mold via hole and the thermal discharge layer correspond to the heat source, such that the semiconductor package is configured to discharge heat generated in the heat source to an outside of the semiconductor package via at least the mold via hole and the thermal discharge layer.

3. The semiconductor package of claim 1, wherein
   the first semiconductor chip includes a logic chip, and
   the second semiconductor chip includes a memory chip.

4. The semiconductor package of claim 1, wherein
   the first semiconductor chip is electrically connected to the wiring substrate via a connection bump, and
   the second semiconductor chip is electrically connected to the wiring substrate via a bonding, wire.

5. The semiconductor package of claim 1, wherein the second semiconductor chip includes a multilayer chip that includes a plurality of sub-chips, the plurality of sub-chips sequentially stacked on the intermediate layer.

6. The semiconductor package of claim 1, wherein the intermediate layer is a heat spreader or an interposer chip.

7. The semiconductor package of claim 1, wherein the mold via hole is at least partially defined by a recess portion recessed from the surface of the intermediate layer into an interior of the intermediate layer.

8. The semiconductor package of claim 1, wherein the mold via hole includes a mold via pattern having a planar constant area on the intermediate layer.

9. The semiconductor package of claim 1, wherein the mold via hole includes a plurality of mold via patterns extending in one direction on the intermediate layer and isolated from direct contact with each other.

10. The semiconductor package of claim 1, wherein the electromagnetic shielding layer extends conformally on a surface defining a bottom of the mold via hole and the one or more inner surfaces defining an inner wall of the mold via hole and on the one or more outer surfaces and opposing side walls of the mold layer.

11. The semiconductor package of claim 1, wherein
   an area of the semiconductor package includes a chip area in which the first semiconductor chip and the second semiconductor chip overlap each other in a vertical direction that extends perpendicular to an upper surface of the wiring substrate and a heat discharge area in which the first semiconductor chip and the second semiconductor chip do not overlap each other in the vertical direction, and the heat discharge area includes the mold via hole and the thermal discharge layer.

12. A semiconductor package, comprising:

a first semiconductor chip on a wiring substrate, the first semiconductor chip electrically connected to the wiring substrate, the first semiconductor chip including a logic chip;

an intermediate layer on the first semiconductor chip, the intermediate layer covering an entire surface of the first semiconductor chip;

a second semiconductor chip on the intermediate layer, the second semiconductor chip electrically connected to the wiring substrate, the second semiconductor chip including a memory chip;

a third semiconductor chip on the intermediate layer, the third semiconductor chip isolated from direct contact with the second semiconductor chip, the third semiconductor chip electrically connected to the wiring substrate, the third semiconductor chip including a separate memory chip;

a mold layer on the wiring substrate, the mold layer covering the first semiconductor chip, the second semiconductor chip, and the third semiconductor chip, the mold layer including one or more inner surfaces at least partially defining a mold via hole that exposes a portion of a surface of the intermediate layer;

an electromagnetic shielding layer on the one or more inner surfaces of the mold layer, the electromagnetic shielding layer further on one or more outer surfaces of the mold layer; and a thermal discharge layer on the electromagnetic shielding layer in the mold via hole such that the thermal discharge layer fills the mold via hole.

13. The semiconductor package of claim 12, wherein the mold via hole is on the intermediate layer and is between the second semiconductor chip and the third semiconductor chip.

14. The semiconductor package of claim 12, wherein the mold via hole on an edge portion of the intermediate layer and is proximate to the second semiconductor chip in relation to the third semiconductor chip and is isolated from direct contact with the second semiconductor chip, or proximate to the third semiconductor chip in relation to the second semiconductor chip and is isolated from direct contact with the third semiconductor chip.

15. The semiconductor package of claim 12, wherein each semiconductor chip of the second semiconductor chip and the third semiconductor chip includes a separate multilayer chip, each separate multilayer chip including a separate plurality of sub-chips that are sequentially stacked on the intermediate layer.

16. The semiconductor package of claim 12, wherein the intermediate layer includes a heat spreader, the first semiconductor chip is electrically connected to the wiring substrate via a connection bump, and the second semiconductor chip and the third semiconductor chip are each electrically connected to the wiring substrate via a separate bonding wire.

17. The semiconductor package of claim 12, wherein the intermediate layer includes an interposer chip, each semiconductor chip of the second semiconductor chip and the third semiconductor chip includes a separate multilayer chip, each separate multilayer chip including a plurality of sub-chips that are sequentially stacked, and each semiconductor chip of the second semiconductor chip and the third semiconductor chip is electrically connected to the wiring substrate via the interposer chip.

18. A semiconductor package, comprising:

a first semiconductor chip on a wiring substrate, the first semiconductor chip electrically connected to the wiring substrate, the first semiconductor chip including a logic chip, the logic chip including a heat source;

an intermediate layer on the first semiconductor chip, the intermediate layer covering an entire surface of the first semiconductor chip;

a second semiconductor chip on the intermediate layer, the second semiconductor chip electrically connected to the wiring substrate, the second semiconductor chip including a memory chip;

a third semiconductor chip on the intermediate layer, the third semiconductor chip isolated from direct contact with the second semiconductor chip, the third semiconductor chip electrically connected to the wiring substrate, the third semiconductor chip including a separate memory chip;

a mold layer on the wiring substrate, the mold layer covering the first semiconductor chip, the second semiconductor chip, and the third semiconductor chip, the mold layer including a plurality of inner surfaces at least partially defining a plurality of mold via holes that expose a portion of a surface of the intermediate layer in both a center region between the second semiconductor chip and the third semiconductor chip and in an edge portion of the intermediate layer;

an electromagnetic shielding layer on the plurality of inner surfaces of the mold layer, the electromagnetic shielding layer further on one or more outer surfaces of the mold layer; and a thermal discharge layer on the electromagnetic shielding layer in each mold via hole of the plurality of mold via holes such that the thermal discharge layer fills the plurality of mold via holes.

19. The semiconductor package of claim 18, wherein the intermediate layer includes a heat spreader, the first semiconductor chip is electrically connected to the wiring substrate via a connection bump, and the second semiconductor chip and the third semiconductor chip are each electrically connected to the wiring substrate via a separate bonding wire.

20. The semiconductor package of claim 18, wherein the intermediate layer includes an interposer chip, the first semiconductor chip is electrically connected to the wiring substrate via a connection bump, each semiconductor chip of the second semiconductor chip and the third semiconductor chip includes a separate multilayer chip, each separate multilayer chip including a separate plurality of sub-chips that are sequentially stacked, and the separate plurality of sub-chips are electrically connected to each other via one or more through vias, and the second semiconductor chip and the third semiconductor chip are each electrically connected to the wiring substrate, via a separate bonding wire, via the interposer chip.

* * * * *